United States Patent [19]
Andoh

[11] Patent Number: 5,917,209
[45] Date of Patent: Jun. 29, 1999

[54] SEMICONDUCTOR DEVICE INCLUDING VIA HOLE AND ISOLATING CIRCUMFERENTIAL MEMBER

[75] Inventor: Naoto Andoh, Tokyo, Japan

[73] Assignee: Mitsubishi Denki Kabushiki Kaisha, Tokyo, Japan

[21] Appl. No.: 08/744,456

[22] Filed: Nov. 7, 1996

[30] Foreign Application Priority Data

Mar. 27, 1996 [JP] Japan .................................. 8-072216

[51] Int. Cl.⁶ .......................... H01L 29/80; H01L 29/00; H01L 31/112
[52] U.S. Cl. .......................... 257/284; 257/506; 257/508
[58] Field of Search .................................. 257/192, 194, 257/280, 284, 506, 508

[56] References Cited

U.S. PATENT DOCUMENTS

| 5,225,707 | 7/1993 | Komaru et al. | 257/513 |
| 5,399,900 | 3/1995 | Ko et al. | 257/607 |
| 5,521,402 | 5/1996 | Ohsawa | 257/85 |

FOREIGN PATENT DOCUMENTS

| 3153057 | 7/1991 | Japan . |
| 439968 | 2/1992 | Japan . |
| 521474 | 1/1993 | Japan . |
| 2239560 | 7/1991 | United Kingdom . |
| 2245424 | 1/1992 | United Kingdom . |

Primary Examiner—Wael M. Fahmy
Attorney, Agent, or Firm—Leydig, Voit & Mayer

[57] ABSTRACT

A semiconductor device includes a semiconductor element, such as a field effect transistor, and an adjacent connection region including a via hole. A simple structure prevents leakage current from flowing from a p-type buffer layer to a source electrode of the field effect transistor through a backside electrode and a via hole upper electrode, avoiding degradation in the gate-source dielectric resistance. A groove having a depth extending from a surface of an n-type semiconductor layer through a n-type semiconductor layer and a p-type buffer layer isolates a field effect transistor from a via hole that extends from the surface of an n-type semiconductor layer to a second surface of a compound semiconductor substrate. The groove prevents leakage current from flowing in a backside electrode in the via hole.

15 Claims, 10 Drawing Sheets

SEMICONDUCTOR DEVICE INCLUDING VIA HOLE AND ISOLATING CIRCUMFERENTIAL MEMBER

BACKGROUND OF THE INVENTION

1. Field of the Invention

The present invention relates to a semiconductor device and a method for manufacturing the same, and more particularly, to a field effect semiconductor integrated circuit device having a via hole in an epitaxial layer in which leakage current from the epitaxial layer to the via hole is positively prevented, as well as to a method of manufacturing such a device.

2. Description of the Related Art

In power amplifiers dealing with high-frequency signals such as high power amplifiers, amplifiers provided at antenna portions of satellite communications equipment, pocket telephones and the like, there have been employed field effect transistors using compound semiconductors capable of providing high power and high speed response.

FIG. 26 illustrates a typical example of such a semiconductor device which is known to the applicant. In this figure, a semiconductor device 1 comprises a semiconductor element 2 in the form of a field effect transistor 2, a compound semiconductor substrate 3 formed of a compound material having a semi-insulating property such as gallium arsenide (GaAs), indium phosphide (InP), etc., a p-type buffer layer 4 formed on the substrate 3, an n-type semiconductor layer 5 formed on the p-type buffer layer 4, and a semiconductor element forming region 6 provided in the n-type semiconductor layer 5, the region 6 acting as an active layer of the field effect transistor. The active layer 6 is formed with a recess 7 in which a gate electrode 8 is provided. A drain electrode 9 and a source electrode 10 are provided on the n-type semiconductor layer 5 on the opposite sides of the gate electrode 8.

In the n-type semiconductor layer 5 there is provided an isolation region 11 which is formed by an ion implantation using an ion source formed, for example, of boron, for the purpose of dividing the area of the active layer 6.

A via hole 12 passes through the substrate 3, the buffer layer 4 and the semiconductor layer 5 so that a backside electrode 13 on the surface of the substrate 3 is electrically connected to a via hole upper electrode 14 in the form of a wiring layer formed on the surface of the semiconductor device 1, the via hole upper electrode 14 being further electrically connected to the source electrode 10.

The semiconductor device 1 is substantially constructed as follows.

The p-type buffer layer 4 and the semiconductor layer 5 are deposited in succession on the substrate 3 and boron ions are implanted or doped into the thus deposited layers while leaving the active layer 6 intact to thereby make the n-type semiconductor layer 5 non-conducive, thus performing regional division between the active layer 6 in the form of a semiconductor element forming region and the isolation region 11.

Subsequently, the drain electrode 9 and the source electrode 10 are formed on the active layer 6 by means of a vapor-deposition and lift-off method, and then the recess 7 is formed by etching and the gate electrode 8 is provided by the vapor-deposition and lift-off method while adjusting a current supplied thereto.

The via hole upper electrode 14 is provided by the vapor-deposition and lift-off method in such a manner that it is electrically connected to the source electrode 10. Thereafter, the via hole 12 is formed through the deposited layers from the substrate side by, for example, sulfuric acid etching, and then the backside electrode 13 is formed by means of, for example, an electrolytic plating method.

In this type of semiconductor device used with a high power amplifier, power amplification is carried out by maintaining the gate voltage at a constant value ranging from 0 V to −1.5 V with the source electrode 10 being connected to ground through the backside electrode 13 and by changing the voltage of the drain electrode 9 between zero volts and a voltage in the range of 3–10 V.

With the conventional semiconductor device as constructed above, boron ions are implanted or doped into the n-type semiconductor 5 to make it nonconductive. In this case, however, in order to perform ion implantation or through acceleration of an element having a large atomic weight such as boron so as to make a regional division between the active layer 6 of the semiconductor element and the isolation region 11, a high power accelerator is required and it is rather difficult to perform ion implantation or doping to a required depth for providing electrical insulation.

In this type of semiconductor device 1, a depth from the surface of the n-type semiconductor layer 5 through the p-type buffer layer 4 is about 2,000 angstroms to 10,000 angstroms so there is the possibility that the p-type buffer layer can not be rendered insulating to a satisfactory extent by means of the ion implantation or doping of boron.

In cases where the p-type buffer layer 4 in the lower portion of the isolation region 11 is not rendered insulating to any satisfactory extent, the gate electrode 8 of the field effect transistor 2 is supplied with a negative voltage, the absolute value of which is less than a pinch-off voltage therefor, so that a forward direction current flows between the depleted active layer 6 and the p-type buffer layer 4, and further from the buffer layer 4 to the source electrode 10 through the backside electrode 11 and the via hole upper electrode 13. Thus, there develops a leakage current between the gate electrode 8 and the source electrode 10, posing the problem that the gate-source dielectric resistance is reduced.

An example of coping with such a problem of leakage current occurring in the inner surface of a via hole is described in Patent Laid-Open No 4-39968. In this example, essential portions of the inner surface of the via hole are doped with ions such as protons, oxygen, etc., to partially isolate the via hole inner surface to thereby provide an isolation layer havingof a thickness in the range of from about 2 micrometers to about 50 micrometers. Thereafter, a via hole wiring layer is formed on the isolation layer whereby a source electrode and a backside electrode are connected to each other, thus preventing leakage current through a buffer layer.

In this case, the active layer, the buffer layer and the substrate, through which the via hole is to be formed, are subjected to ion implantation or doping to first provide the isolation layer or semi-insulating region, and thereafter the via hole is subsequently formed through the layers while leaving the isolation region.

Here, it is to be noted that if protons are used with this method, electrical properties of a field effect transistor, a heterojunction bipolar transistor (HBT) and the like having a high mobility transistor (HEMT) type structure may be adversely be affected by protons. Therefore, it is rather difficult to employ this method in general as a versatile technology.

Another example is disclosed in Patent Laid-Open No. 3-153057 in which an insulating film such as a silicon nitride film, a silicon oxide film and the like is formed on the inner surface of a via hole by means of a chemical vapor deposition (CVD) method, a via hole wiring layer is then formed on the insulating film to thereby provide electrical connection between a source electrode and a backside electrode. In this manner, leakage current through a buffer layer is prevented.

In this case, however, an etching process is required in which formation of a master pattern and etching are performed for removing the insulating film which is disposed on the backside surface of the source electrode and directed toward the inside of the via hole prior to the processes in which the via hole is formed through the deposited layers from the side of the semiconductor substrate, with the insulating film being then formed on the inner surface of the via hole and the via hole wiring layer being formed thereon to provide electrical connection between the source electrode and the backside electrode.

SUMMARY OF THE INVENTION

The present invention is intended to solve the above described problems and has for its object the provision of a novel and improved semiconductor device in which a buffer layer and a source layer are electrically isolated through a simple isolation structure.

Another object of the preset invention is to provide a novel and improved method of manufacturing a semiconductor device in which an isolation layer can be formed on an inner wall of a via hole through a simple process to provide electrical isolation between the buffer electrode and the source electrode.

Bearing the above objects in mind, according to one aspect of the present invention, there is provided a semiconductor device comprising:

a semiconductor substrate having a first surface and a second surface;

a first semiconductor layer disposed on the first surface of the semiconductor substrate;

a second semiconductor layer disposed on the first semiconductor layer having opposite polarity in electrical conduction with respect to the first semiconductor layer, the second semiconductor layer having a semiconductor element forming region and a remaining portion;

a semiconductor element selectively disposed on the semiconductor element forming region of the second semiconductor layer;

an ion doped region selectively disposed in the remaining portion of the second semiconductor layer for isolating the semiconductor element forming region from the remaining portion of the second semiconductor layer;

a cylindrical inner wall selectively disposed in the remaining portion of the second semiconductor layer and extending from the second semiconductor layer to the second surface of the semiconductor substrate, the inner wall defining therein a via hole;

step means disposed in the first and second semiconductor layers and having a depth extending from the surface of the second semiconductor layer through the first semiconductor layer for isolating the inner wall from the semiconductor element forming region;

a conductive layer disposed on the surface of the inner wall and electrically connected to the first semiconductor layer; and a wiring layer disposed on the surface of the second semiconductor layer and electrically connected to the conductive layer, the wiring layer being electrically connected to a portion of the semiconductor element across the step means.

With the above arrangement, the cylindrical inner wall of the via hole extending from the surface of the second semiconductor layer to the second surface of the semiconductor substrate is isolated from the semiconductor element forming region by virtue of the step means having a depth extending from the surface of the second semiconductor layer across the first semiconductor layer, so that even if the first semiconductor layer is not rendered nonconductive to a satisfactory extent, it is possible to positively prevent leakage current from flowing in the conductive layer electrically connected to the first semiconductor layer disposed on the inner wall of the via hole. As a result, reduction or degradation of the dielectric resistance of the semiconductor device can be avoided.

In a preferred form of the invention, the step means surrounds the inner wall or the semiconductor element forming region.

With such an arrangement, the step means can be disposed effectively in accordance with the number of the semiconductor elements or inner walls as employed on the basis of the frequency bands used with the semiconductor device, so that the area or volume of the step means, which is a non-essential component, can be reduced, thus enhancing the area or space efficiency of the semiconductor device.

In another preferred form of the invention, the step means comprises a groove having an opening on the surface of the second semiconductor layer.

Thus, a surface area required for forming the step means is reduced, further enhancing area efficiency or area saving of the semiconductor device.

In a further preferred form of the invention, the semiconductor device further includes an active region of the semiconductor element, and the semiconductor element comprises a source electrode, a gate electrode and a drain electrode all disposed on the surface of the active region of the semiconductor element, either one of the source electrode and the drain electrode being connected to the wiring layer.

With the above arrangement, reduction in the dielectric resistance of the semiconductor device particularly in the form of a field effect transistor can be prevented in an effective manner.

In a further preferred form of the invention, the semiconductor substrate is formed of a compound semiconductor material.

Thus, with the semiconductor device in the form of a field effect transistor comprising a compound semiconductor mainly used in particular for a high-frequency range, the semiconductor element can be electrically isolated from the cylindrical inner wall, it is possible to prevent leakage current from flowing between the gate electrode and the source or drain electrode through the conductive layer which is disposed on the cylindrical inner wall and the surface of the semiconductor substrate for enhancing cooling efficiency. As a result, reduction in the dielectric resistance of the semiconductor element can be prevented while cooling the semiconductor element in an effective manner.

In a further preferred form of the invention, the compound semiconductor material is a semi-insulating material comprising gallium arsenate or indium phosphide.

Thus, with the semiconductor device in the form of a field effect semiconductor device composed of gallium arsenate or indium phosphide, reduction in the dielectric resistance of the semiconductor element can be prevented while effectively cooling the semiconductor element.

In accordance with another aspect of the present invention, there is provided a method of manufacturing a semiconductor device, the method comprising the steps of:

successively forming a first semiconductor layer and a second semiconductor layer on a first surface of a semiconductor substrate, the first and second semiconductor layers having opposite polarities in electrical conduction with respect to each other;

selectively forming a semiconductor element on the second semiconductor layer;

forming a first resist pattern on the surface of the second semiconductor layer so as to cover a semiconductor element forming region thereof at which the semiconductor element is formed;

performing ion implantation into the first and second semiconductor layers so as to electrically isolate the semiconductor element forming region from a remaining portion of the second semiconductor layer with the first resist pattern used as a mask;

forming a second resist pattern having an aperture on the surface of the second semiconductor layer in such a manner that the aperture surrounds a specific portion of the second semiconductor layer at which a cylindrical inner wall is to be later provided;

removing parts of the first and second semiconductor layers on the semiconductor substrate to such a depth extending from the surface of the second semiconductor layer to the first surface of the semiconductor substrate to thereby provide a step with the second resist pattern used as a mask;

forming a first wiring layer at a location corresponding to the cylindrical inner wall and a second wiring layer extending from the first wiring layer through the step to a portion of the semiconductor element on the second semiconductor layer;

forming a third resist pattern having an aperture on a second surface of the semiconductor substrate in such a manner that the aperture is disposed in opposition to the first wiring layer;

removing a part of the semiconductor substrate from the second surface thereof to such a depth as to expose the first wiring layer to thereby define the cylindrical inner wall; and providing an electrically conductive layer on the first wiring layer and the surface of the cylindrical inner wall for electrically connecting the first semiconductor layer and the first wiring layer.

With the semiconductor manufacturing method as constructed above, even if the first semiconductor layer is not rendered nonconductive to any satisfactory extent, it is possible to prevent leakage current from flowing in the insulating layer electrically connected to the first semiconductor layer on the surface of the inner wall. This serves to provide the semiconductor device which is prevented from reduction in the dielectric resistance by means of simple process steps.

In accordance with a further aspect of the present invention, there is provided a method of manufacturing a semiconductor device, the method comprising the steps of:

successively forming a first semiconductor layer and a second semiconductor layer on a first surface of a semiconductor substrate, the first and second semiconductor layers having opposite polarities in electrical conduction with respect to each other;

selectively forming a semiconductor element on the second semiconductor layer;

forming a first resist pattern on the surface of the second semiconductor layer so as to cover a semiconductor element forming region thereof at which the semiconductor element is formed;

performing ion implantation into the first and second semiconductor layers so as to electrically isolate the semiconductor element forming region from a remaining portion of the second semiconductor layer with the first resist pattern used as a mask;

forming a first wiring layer selectively on the remaining portion of the second semiconductor layer and a second wiring layer extending from the first wiring layer to a portion of the semiconductor element on the second semiconductor layer;

forming a second resist pattern having an aperture on a second surface of the semiconductor substrate in such a manner that the aperture is disposed in opposition to the first wiring layer;

removing, by means of wet etching, a part of the semiconductor substrate from the second surface thereof to such a depth as to expose the first wiring layer to thereby define a hole;

removing the second resist pattern from the second surface of the semiconductor substrate;

providing an ion doped layer in the second surface of the semiconductor substrate and an inner wall of the hole; and providing an electrically conductive layer connected to an exposed surface of the first wiring layer at the side of the hole through the intermediary of the ion doped layer.

With this semiconductor device manufacturing method, a step of forming an electrically insulating film on the inner wall of the hole is omitted, so a mask pattern forming step for forming an insulating film on the inner wall except for the exposed rear surface of the first wiring layer can be made unnecessary, thereby enabling the production of the semiconductor device which is prevented from reduction in the dielectric resistance, with simple process steps.

In accordance with a further aspect of the present invention, there is provided a method of manufacturing a semiconductor device, the method comprising the steps of:

successively forming a first semiconductor layer and a second semiconductor layer on a first surface of a semiconductor substrate, the first and second semiconductor layers having opposite polarities in electrical conduction with respect to each other;

selectively forming a semiconductor element on the second semiconductor layer;

forming a first resist pattern on the surface of the second semiconductor layer so as to cover a semiconductor element forming region thereof at which the semiconductor element is formed;

performing ion implantation into the first and second semiconductor layers so as to electrically isolate the semiconductor element forming region from a remaining portion of the second semiconductor layer with the first resist pattern used as a mask;

forming a first wiring layer selectively on the remaining portion of the second semiconductor layer and a second wiring layer extending from the first wiring layer to a portion of the semiconductor element on the second semiconductor layer;

forming a second resist pattern having an aperture on a second surface of the semiconductor substrate in such a manner that the aperture is disposed in opposition to the first wiring layer;

removing, by means of wet etching, a part of the semiconductor substrate from the second surface thereof to such a depth as to expose the first wiring layer to thereby define a hole;

depositing an insulating layer on the inner wall of the hole from the surface of the second resist pattern with the second resist pattern used as a mask;

removing, by means of a reactive ion etching, the insulating layer to such an extent as to expose the first wiring layer from the surface of the second resist pattern with the second resist pattern used as a mask;

removing the second resist pattern from the second surface of the semiconductor substrate; and providing an electrically conductive layer on the exposed surface of the first wiring layer at the side of the hole and on the inner wall of the hole.

With the semiconductor device manufacturing method as constructed above, the insulating layer can be provided while leaving the resist pattern which is used for forming the hole, and the insulating film in contact with the via hole upper electrode is removed by a reactive ion etching (RIE) method from the rear surface of the wafer by utilizing the aperture in the resist pattern, so it is possible to omit a mask pattern forming step for partially removing the insulating film which is provided after formation of the hole, thus simplifying the entire process steps.

In accordance with a further aspect of the present invention, there is provided a method of manufacturing a semiconductor device, the method comprising the steps of:

successively forming a first semiconductor layer and a second semiconductor layer on a first surface of a semiconductor substrate, the first and second semiconductor layers having opposite polarities in electrical conduction with respect to each other;

selectively forming a semiconductor element on the second semiconductor layer;

forming a first resist pattern on the surface of the second semiconductor layer so as to cover a semiconductor element forming region thereof at which the semiconductor element is formed;

performing ion implantation into the first and second semiconductor layers so as to electrically isolate the semiconductor element forming region from a remaining portion of the second semiconductor layer with the first resist pattern used as a mask;

forming a first wiring layer selectively on the remaining portion of the second semiconductor layer and a second wiring layer extending from the first wiring layer to a portion of the semiconductor element on the second semiconductor layer;

forming a second resist pattern having an aperture on a second surface of the semiconductor substrate in such a manner that the aperture is disposed in opposition to the first wiring layer;

removing, by means of wet etching, a part of the semiconductor substrate from the second surface thereof to such a depth as to expose the first wiring layer to hereby define a hole;

enlarging the aperture in the second resist pattern to an end opening of the hole at the second surface of the semiconductor substrate;

depositing an insulating layer on the inner wall of the hole other than the exposed surface of the first wiring layer from the surface of the second resist pattern with the second resist pattern having the thus enlarged aperture used as a mask;

removing, by means of a reactive ion etching, the insulating layer to such an extent as to expose the first wiring layer from the surface of the second resist pattern in an oblique direction thereof with the second resist pattern used as a mask;

removing the second resist pattern from the second surface of the semiconductor substrate; and providing an electrically conductive layer on the exposed surface of the first wiring layer at the side of the hole and on the inner wall of the hole.

With the semiconductor element manufacturing method as defined above, a master pattern forming step for partially removing the insulating film which is provided after the formation of the hole is omitted, thus simplifying the entire process steps.

In accordance with a further aspect of the present invention, there is provided a method of manufacturing a semiconductor device, the method comprising the steps of:

successively forming a first semiconductor layer and a second semiconductor layer on a first surface of a semiconductor substrate, the first and second semiconductor layers having opposite polarities in electrical conduction with respect to each other;

selectively forming a semiconductor element on the second semiconductor layer;

forming a first resist pattern on the surface of the second semiconductor layer so as to cover a semiconductor element forming region thereof at which the semiconductor element is formed;

performing ion implantation into the first and second semiconductor layers so as to electrically isolate the semiconductor element forming region from a remaining portion of the second semiconductor layer with the first resist pattern used as a mask;

forming a first wiring layer selectively on the remaining portion of the second semiconductor layer in which a through hole is provided, and a second wiring layer extending from the first wiring layer to a portion of the semiconductor element on the second semiconductor layer;

forming a first translucent insulating film on the second semiconductor layer so as to cover the first and second wiring layers;

forming a second resist pattern having an aperture on a second surface of the semiconductor substrate in such a manner that the aperture is disposed in opposition to the first wiring layer;

depositing a second insulating film on an inner wall of the hole from the second surface of the semiconductor substrate;

forming a resist film on the second insulating film formed on the inner wall of the hole from the second surface of the semiconductor substrate;

projecting light toward the first insulating film so as to expose the resist film via the through hole in the first and second wiring layers to thereby provide a mask pattern having an opening therein;

removing parts of the first and second insulating films with the mask pattern having the opening used as a mask; and providing an electrically conductive layer on the inner wall of the hole and on the first insulating film exposed into the hole.

With the semiconductor device manufacturing method as defined above, no mask matching at the backside of a wafer is required, thereby simplifying the entire process steps.

In accordance with a further aspect of the present invention, there is provided a semiconductor device comprising:

a semiconductor substrate having a first surface and a second surface;

a first semiconductor layer disposed on the first surface of the semiconductor substrate;

a second semiconductor layer disposed on the first semiconductor layer having opposite polarity in electrical conduction with respect to the first semiconductor layer, the second semiconductor layer having a semiconductor element forming region and a remaining portion;

a semiconductor element selectively disposed on the semiconductor element forming region of the second semiconductor layer;

a proton doped region selectively disposed in the remaining portion of the second semiconductor layer for isolating the semiconductor element forming region from the remaining portion of the second semiconductor layer;

a cylindrical inner wall selectively disposed in the remaining portion of the second semiconductor layer and extending from the second semiconductor layer to the second surface of the semiconductor substrate, the inner wall defining therein a via hole;

a conductive layer disposed on a surface of the inner wall and electrically connected to the inner wall in the first semiconductor layer; and a wiring layer disposed on the surface of the second semiconductor layer and electrically connected to the conductive layer and a portion of the semiconductor element.

With the semiconductor device manufacturing method as defined above, the provision of the proton doping region selectively disposed in the remaining portion of the second semiconductor layer for electrically isolating the semiconductor element forming region from the remaining portion serves to reduce the cost of manufacturing the semiconductor device.

The above and other objects, features and advantages of the present invention will become more readily apparent to the those skilled in the art as the description proceeds when taken in conjunction with the accompanying drawings.

DESCRIPTION OF THE PREFERRED EMBODIMENTS

Now, preferred embodiments of the present invention will be described in detail while referring to the accompanying drawings.

Embodiment 1

Figure 1:
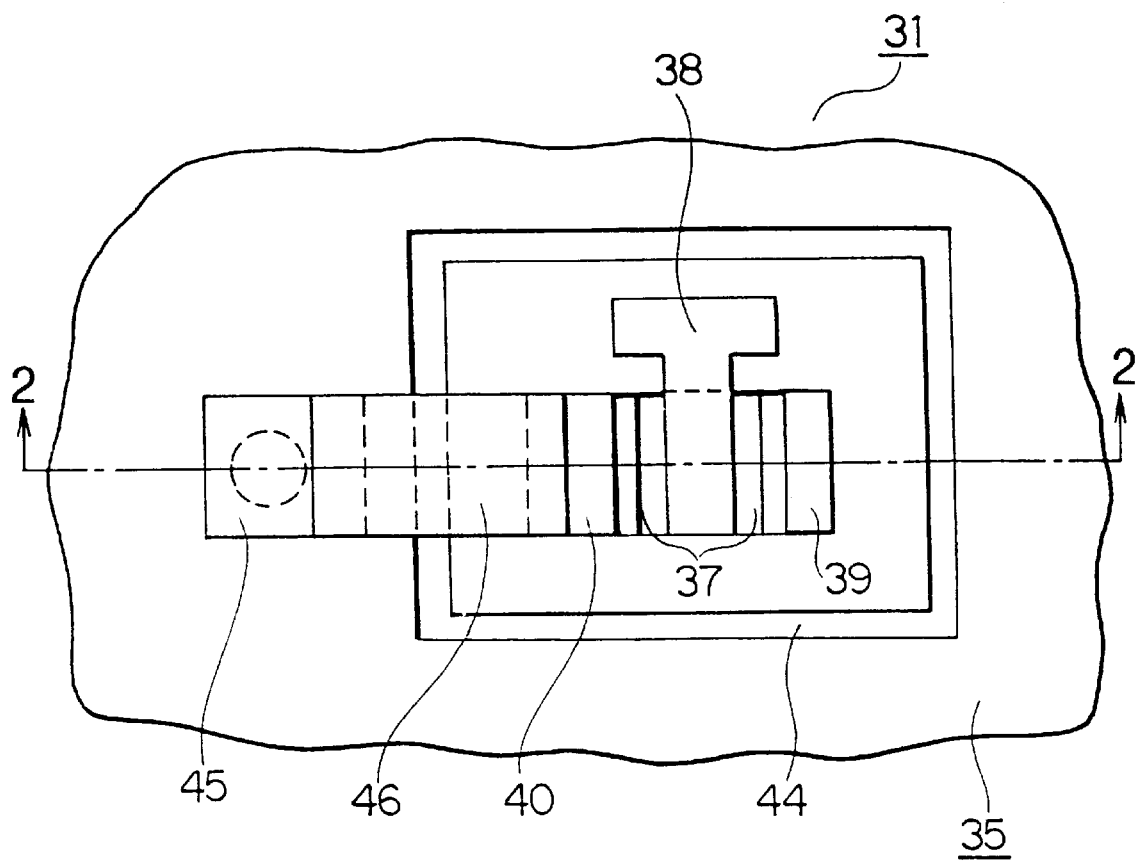
FIG. 1 is a plan view of a semiconductor device according to a first embodiment of the invention.
Figure 2:
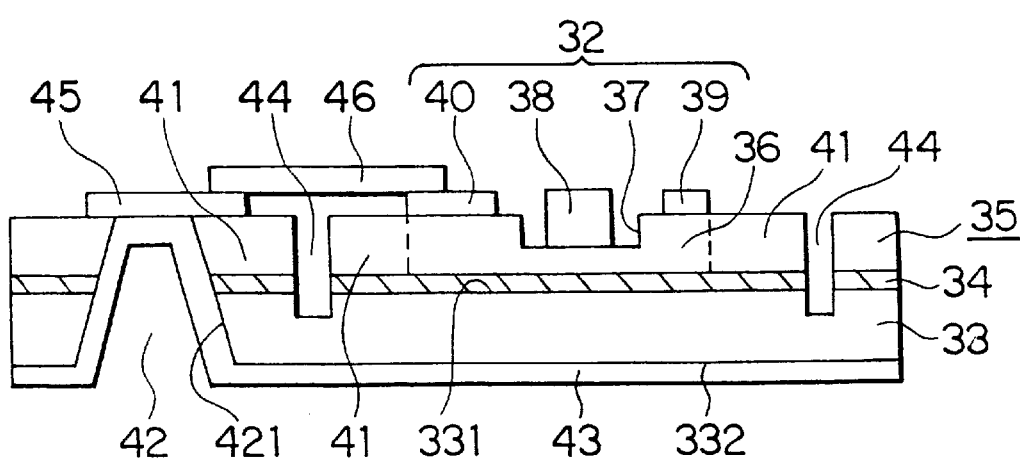
FIG. 2 is a cross sectional view taken along line 2—2 of FIG. 1.

Referring to the drawings, FIGS. 1 and 2 illustrate a semiconductor device including a field effect transistor constructed in accordance with a first embodiment of the present invention.

In FIGS. 1 and 2, a semiconductor device, generally designated at reference numeral 31, comprises a field effect transistor 32, compound semiconductor substrate 33 of a semi-insulating compound semiconductor having a partially insulating property such as gallium arsenide (GaAs), indium phosphide (InP) and the like, a p-type buffer layer 34 on a first or front surface 331 of the compound semiconductor substrate 33, an n-type semiconductor layer 35 on the p-type buffer layer 34, and a semiconductor element forming region in the form of an active layer 36 of the field effect transistor 32 provided in the n-type semiconductor layer 35.

The active layer 36 includes a recess 37 in which a gate electrode 38 is disposed with a drain electrode 39 and a source electrode 40 being respectively provided on the surface of the active layer 36 on opposite sides of the gate electrode 38.

The active layer 36 is divided into regions by means of an electrically isolating region or isolation region 41 in the form of an ion implanted region using boron as a dopnant.

A via hole 42 passes through the semiconductor substrate 33, the p-type buffer layer 34 and the n-type semiconductor layer 36, which have a common inner wall or surface 421 defining the via hole 42 and extending through these layers.

A backside electrode 43 is formed on and along a second or rear surface 332 of the compound semiconductor substrate 33 and the via hole inner wall 421 in intimate contact therewith.

A groove 44 is provided in the isolation region 41 with its depth extending from the surface of the n-type semiconductor layer 35 to the compound semiconductor substrate 33 through the p-type buffer layer 34.

A via hole upper electrode 45 is formed on the surface of the semiconductor device 31 at a location over the via hole 42 in electrical contact with the backside electrode 43. The via hole upper electrode 45 is electrically connected to the source electrode 40 through a bridging wire 46 which extends across the groove 44.

Next, a method of manufacturing the semiconductor device 31 as constructed above will be described while referring to FIGS. 3 through 9 which illustrate respective process steps in the manufacturing of the semiconductor device 31 according to the first embodiment of the invention.

Figure 3:
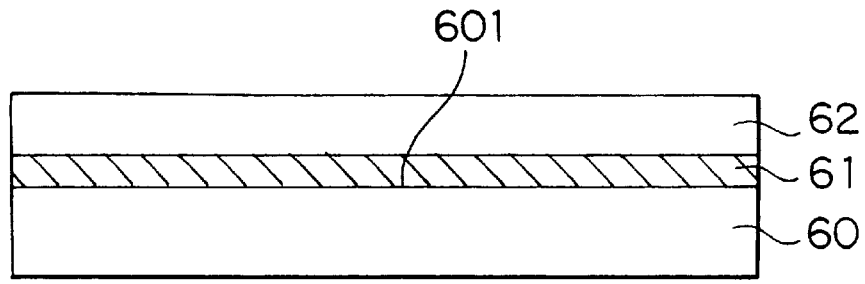
FIG. 3 is a cross sectional view showing a process step for manufacturing the semiconductor device according to the first embodiment of the invention.

First, a GaAs layer 61 constituting the buffer layer 34 and an n-type GaAs layer 62 constituting the active layer 36 are successively deposited on one surface 601 of the n-type GaAs substrate 60 by means of Metalorganic Chemical Vapor Deposition (MOCVD) method. For example, the thicknesses of these layers are as follows: the GaAs substrate 60 is about 600 micrometers thick; the p-type GaAs layer 61 is in the range of from about 4,000 angstroms to 5,000 angstroms thick; the n-type GaAs layer 62 is about 6,000 angstroms thick. FIG. 3 shows the semiconductor device produced in this process step. Though the MOCVD method is employed herein, Molecular Beam Epitaxial method can instead be used.

Figure 4:
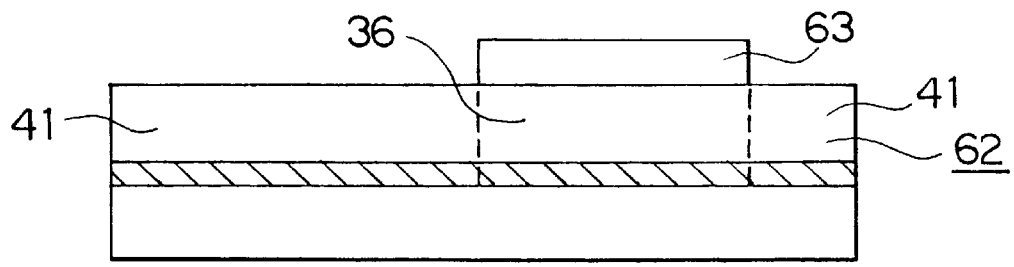
FIG. 4 is a cross sectional view showing another process step for manufacturing the semiconductor device according to the first embodiment of the invention.

Subsequently, as shown in FIG. 4, a resist pattern 63 masking only a portion of the surface of the n-type GaAs layer 62 at which the FET 32 is provided is formed by of a lithography process. With the resist pattern 63 used as a mask, boron ions are implanted into the n-type GaAs layer 62 to provide the isolation region 41. In this regard, since the atomic weight of boron is large, a special high-power ion implanting apparatus is required in order to implant boron ions into the n-type GaAs layer 62 to a satisfactory depth. Thus, with the ordinary ion implanting apparatus, a sufficient acceleration voltage is not obtained so that the p-type GaAs layer 61 can not sometimes be rendered insulating to any satisfactory extent. One example of doping conditions for two dopings is as follows:

For the first doping:
Acceleration Voltage: 300 keV;
Dose Quantity: $4.0 \times 10^{11}/cm^2$
For the second doping:
Acceleration Voltage: 80 keV;
Dose Quantity: $4.0 \times 10^{11}/cm^2$ FIG. 4 shows, in cross section, the semiconductor device as produced in this process step.

Figure 5:
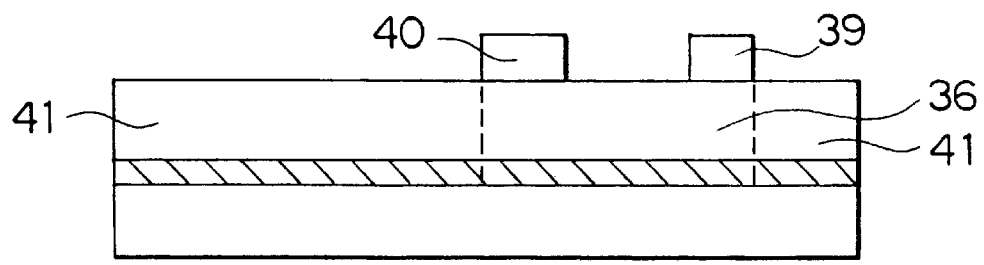
FIG. 5 is a cross sectional view showing a further process step for manufacturing the semiconductor device according to the first embodiment of the invention.

Thereafter, the resist pattern 63 is removed, and, on the surface of the active layer 36 surrounded by the isolation region 41, there is formed a resist pattern having apertures at locations corresponding to the source electrode 40 and the drain electrode 39 using a lithography process. Then, with the resist pattern used as a mask, the source electrode 40 and the drain electrode 39 are formed with aluminum by means of a technique such as deposition and lift-off. FIG. 5 shows the semiconductor device formed in this process step.

Figure 6:
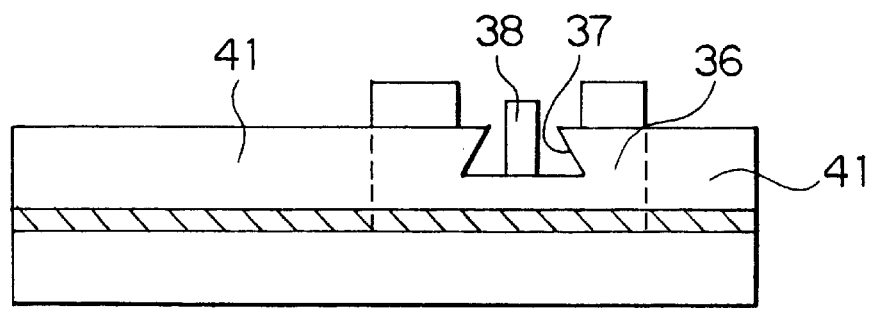
FIG. 6 is a cross sectional view showing a further process step for manufacturing the semiconductor device according to the first embodiment of the invention.

As shown in FIG. 6, a recess 37 is then formed in the isolation region 41 by an etching process, and the gate electrode 38 is formed in the recess 37 by the deposition and lift-off method.

Figure 7:
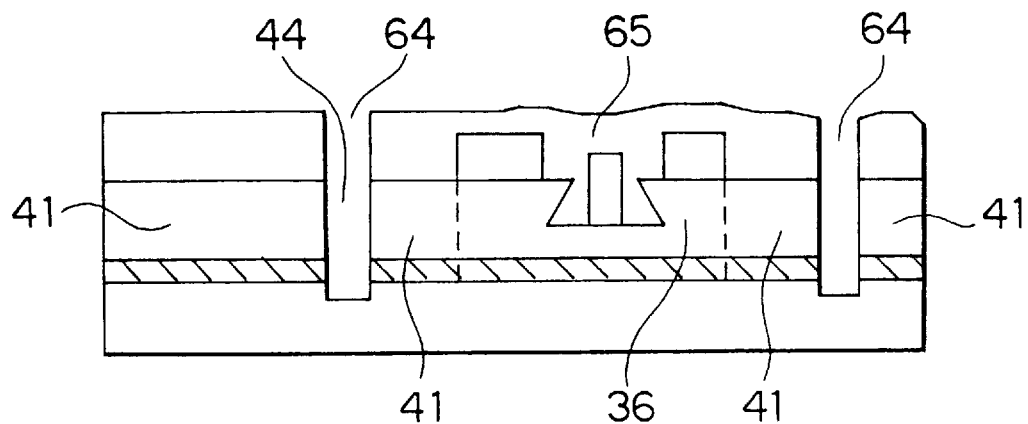
FIG. 7 is a cross sectional view showing a further process step for manufacturing the semiconductor device according to the first embodiment of the invention.

Subsequently, as shown in FIG. 7, using lithography, a resist pattern 65 is formed which has apertures 64 at locations corresponding to the grooves 44 in the isolation region 41. With the resist pattern 65 used as a mask, portions of the semiconductor layers are removed by etching to a depth extending from the surface of the isolation region 41 of the n-type GaAs layer 62 to the p-type GaAs layer 61 through the p-type buffer layer 34. An etching liquid employed in this process is tartaric acid, for example.

Figure 8:
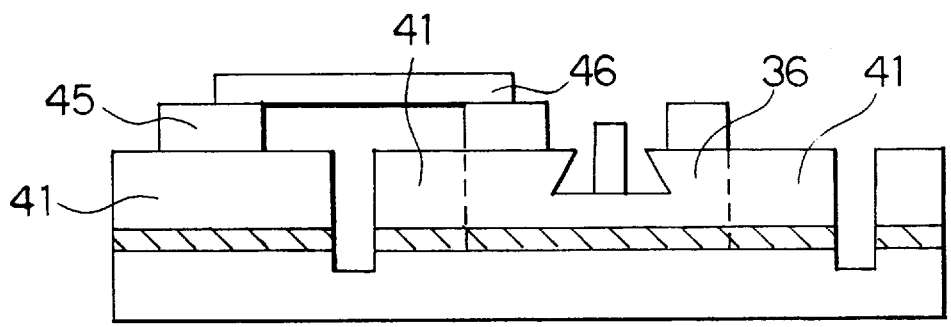
FIG. 8 is a cross sectional view showing a further process step for manufacturing the semiconductor device according to the first embodiment of the invention.

Thereafter, the resist pattern 65 is removed and, by means of the deposition and lift-off method, the via hole upper electrode 45 is formed on the surface of the isolation region 41 in intimate contact therewith at a location at which the via hole 42 is to be later provided. The bridging wire layer 46 is formed by electrolytic plating for keeping the via hole upper electrode 45 and the source electrode 40 electrically connected to each other. FIG. 8 shows, in cross section, the semiconductor device formed in this process step.

Figure 9:
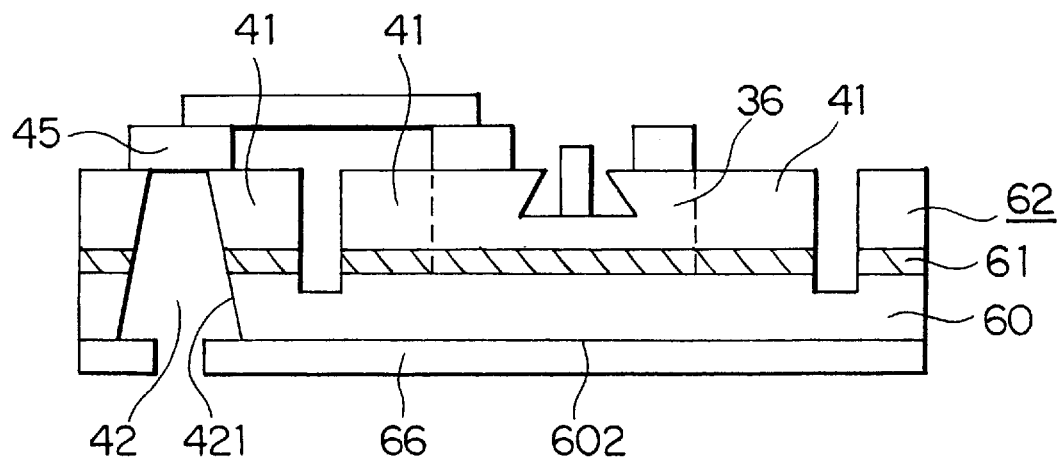
FIG. 9 is a cross sectional view showing a further process step for manufacturing the semiconductor device according to the first embodiment of the invention.

Further, a resist is applied to the second or rear surface 602 of the GaAs substrate 60 opposite the first surface 601 to form a resist pattern 66 having an aperture at a location opposing the via hole upper electrode 45, by means of lithography. Then, using the resist pattern 66 as a mask, the GaAs substrate 60, the p-type GaAs layer 61 and the n-type GaAs layer 62 are partially removed through etching to expose the backside of the via hole upper electrode 45 and define the via hole 42 surrounded by the inner wall 421. In this etching process, sulfuric acid is employed as an etching liquid, for example. FIG. 9 shows the semiconductor device as produced in this process step.

Thereafter, the resist pattern 66 is removed, and then the backside electrode 43 is formed, for example, by electrolytic plating on the second surface of the GaAs substrate 60, the inner wall 421 of the via hole 42 and the exposed backside surface of the via hole upper electrode 45. The semiconductor device thus formed in this process step is shown in FIGS. 1 and 2.

The operation of the semiconductor device 31 as constructed above will now be described below while referring to FIGS. 1 and 2.

With this kind of semiconductor device 31 used, for example, with a high power amplifier, power amplification is effected by maintaining the gate electrode 38 at a voltage ranging from 0 V to −1.5 V, with the source electrode 40 being connected to ground through the backside electrode 43, and by switching the drain electrode 39 between 0 V and a voltage of 3 V to −1.5 V to thereby maintain the gate-drain dielectric resistance. In this case, a negative voltage less than a pinch-off voltage is applied to the gate electrode 38 of the field effect transistor 32, so that a forward direct current flows between the depleted active layer 36 and the p-type buffer layer 34. Thus, even though the p-type buffer layer 34 is not made conductive due to insufficient doping with B$^+$ ions, the p-type buffer layer 34 beneath the FET 32 is isolated by the groove 44 to break electrical conduction between the p-type buffer layer 34 and the backside electrode 43, thereby preventing leakage current from flowing between the gate electrode 38 and the source electrode 40 and hence degradation of the gate-source dielectric resistance.

In this manner, the groove 44 is disposed so as to surround the FET 32 which is suitable for application to a semiconductor device having a high frequency band, e.g., higher than 4 to 5 GHz. This is because the semiconductor device at such a high frequency band generates a greater amount of heat so that the number of via holes has to be increased for effective cooling. Another reason for increasing the number of via holes is to reduce the impedance of the semiconductor device. As a result, the arrangement of the groove 44 surrounding the FET 32 serves to reduce the surface area required and hence the specific surface area of the groove 44 relative to the entire semiconductor device, thereby enhancing area efficiency of the semiconductor element as well as miniaturizing of the semiconductor device.

Embodiment 2

Figure 10:
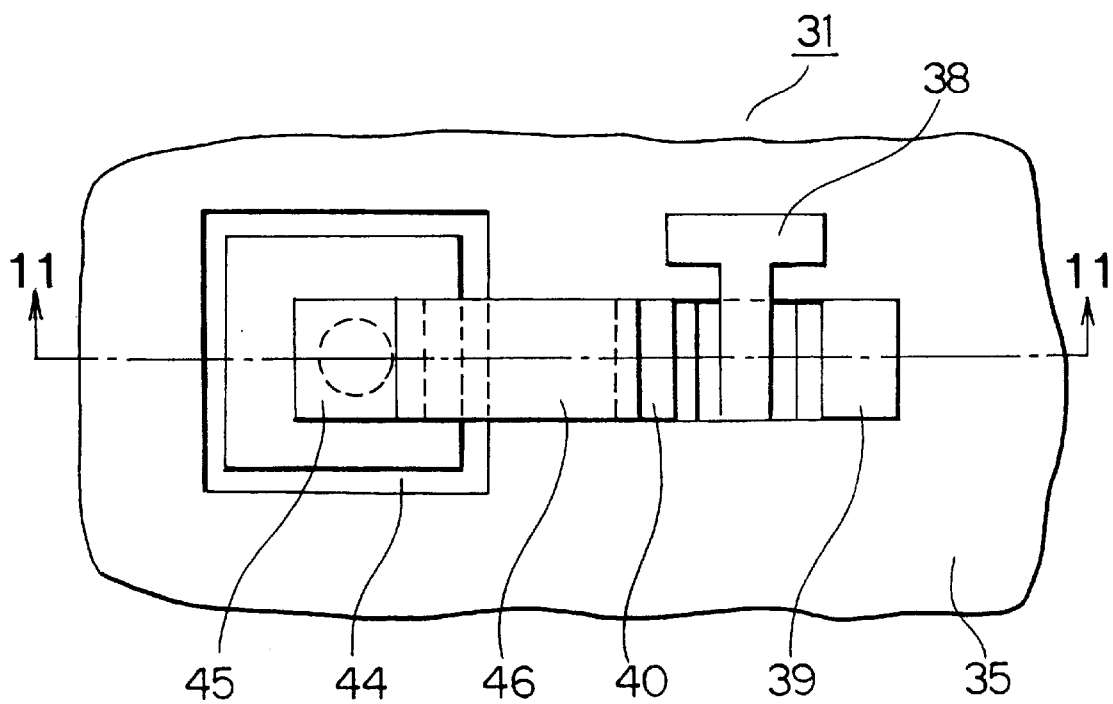
FIG. 10 is a plan view of a semiconductor device according to a second embodiment of the invention.
Figure 11:
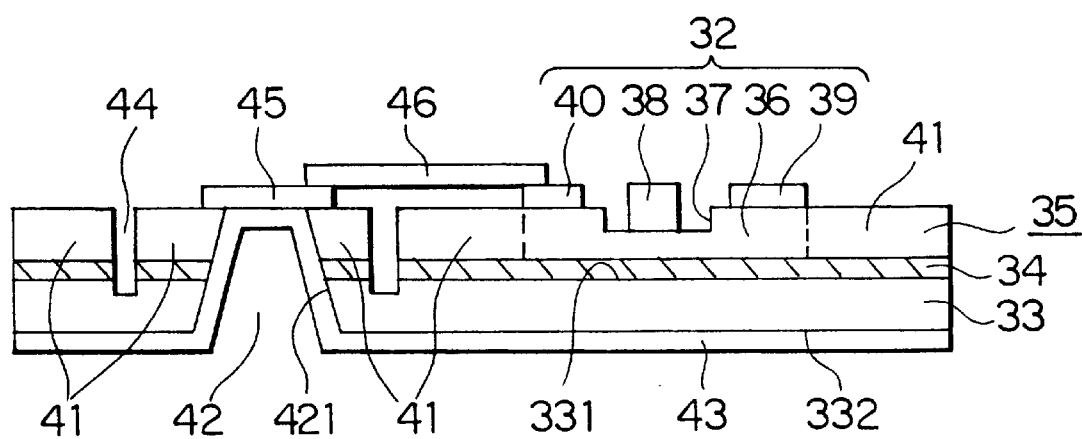
FIG. 11 is a cross sectional view taken along line II—II of FIG. 10.

FIGS. 10 and 11 show another semiconductor device constructed in accordance with a second preferred embodiment of the present invention.

As shown in these Figures, the semiconductor device 31 with an FET 32 in this second embodiment is different from the previously described first embodiment in that in the former, a groove 44 surrounds the via hole 42. The other construction of this embodiment is substantially similar to that of the first embodiment. Thus, the like or corresponding parts are identified by the same symbols.

The method of manufacturing the semiconductor device according to this second embodiment is substantially similar to that of the first embodiment except for the process of forming the groove 44. That is, in this process, an aperture (not shown) is formed in a resist pattern (not shown) in such a manner that it surrounds the via hole 42.

Accordingly, the operation of the second embodiment is substantially similar to that of the first embodiment, but this embodiment is particularly suitable to a semiconductor device at a relatively low frequency band, e.g., lower than 10 Hz. With such a low-frequency semiconductor device, the number of via holes required is limited from the standpoints of cooling and low impedance, so the surface area required of the groove 44 is small, thus enabling a reduction in the surface area of the groove 44 occupied relative to the entire semiconductor device. As a result, area efficiency of the semiconductor element is enhanced to miniaturize the entire semiconductor device.

Embodiment 3

Figure 12:
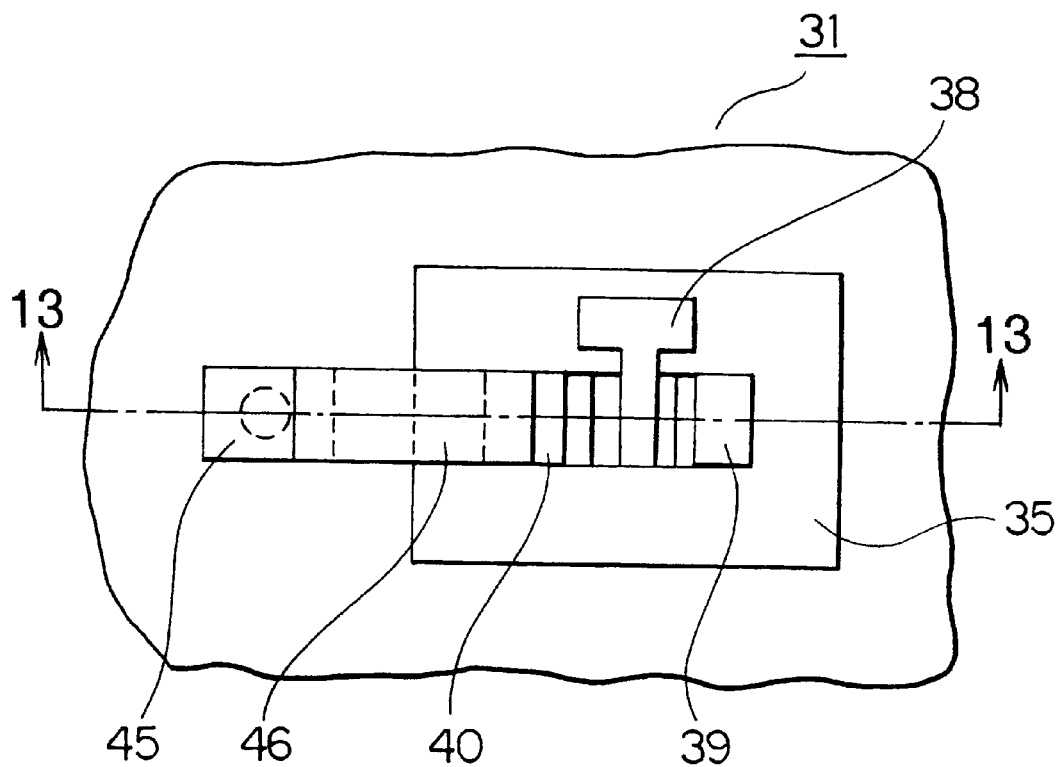
FIG. 12 is a plan view of a semiconductor device according to a third embodiment of the invention.
Figure 13:
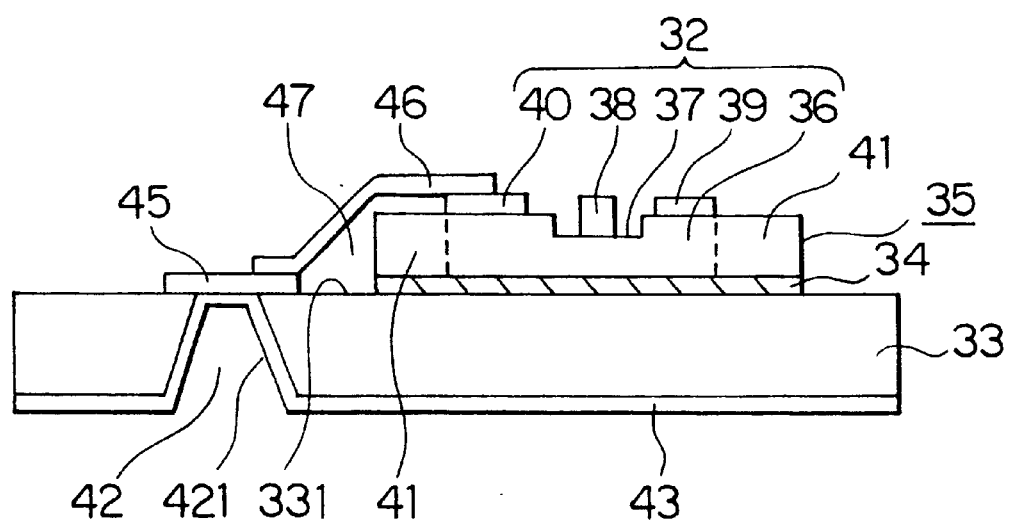
FIG. 13 is a cross sectional view taken along line 13—13 of FIG. 12.

FIGS. 12 and 13 show a semiconductor device constructed according to a third embodiment of the present invention. In FIG. 12, reference numeral 47 designates a step which rises or extends from a first surface 331 of a compound semiconductor substrate 33 on which a p-type buffer layer 34 and an n-type semiconductor layer 35 are disposed in succession. The p-type buffer layer 34 and the n-type semiconductor layer 35 both have the same area, less than the area of the semiconductor substrate 33. A via hole 42 is formed through the semiconductor substrate 33. A backside electrode 43 is provided on a second or backside surface of the semiconductor substrate 33 and an inner wall of the via hole 42 in intimate contact therewith. A via hole upper electrode 45 is formed on a first or front surface of the semiconductor substrate 33 at the via hole 42 in electrical contact with the backside electrode 43. The via hole upper electrode 45 is electrically connected to a source electrode 40 on the n-type semiconductor layer 35 by means of a bridging wire 46 which is disposed astride the step 47. The other construction of this embodiment is substantially the same as those of the aforementioned first and second embodiments.

A method for manufacturing the semiconductor device according to this embodiment is substantially similar to the methods for manufacturing the first and second embodiments except for a process of forming the groove 44. That is, an aperture in a resist pattern is formed such that it covers a portion of the n-type semiconductor layer 35 that is to be later made into an active layer 36 and a limited portion of an isolation region 41 surrounding the active layer 36.

In this embodiment, the depth of the via hole 42 is equal to the thickness of the compound semiconductor substrate 33, so that the length of a heat conducting path leading to the backside electrode 43 becomes short, thus enhancing cooling efficiency.

Embodiment 4

Figure 14:
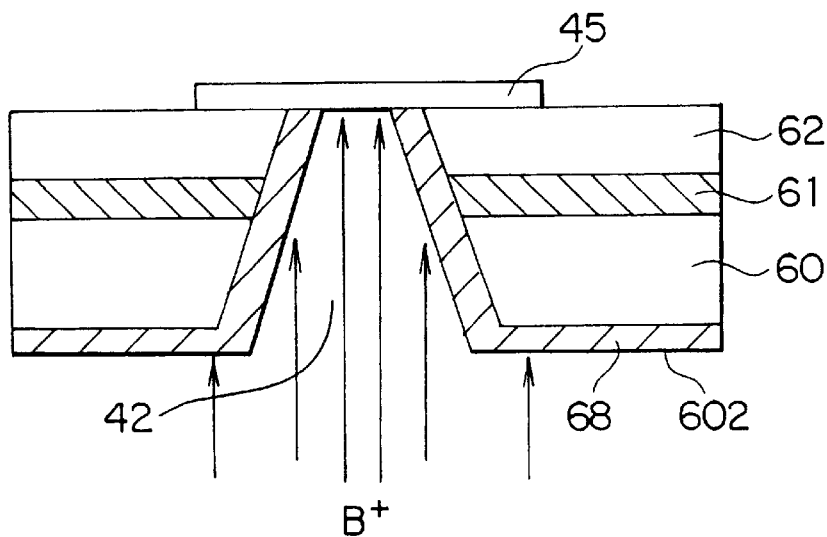
FIG. 14 is a partially broken view showing a process step of a method for manufacturing a semiconductor device according to a fourth embodiment of the invention.
Figure 15:
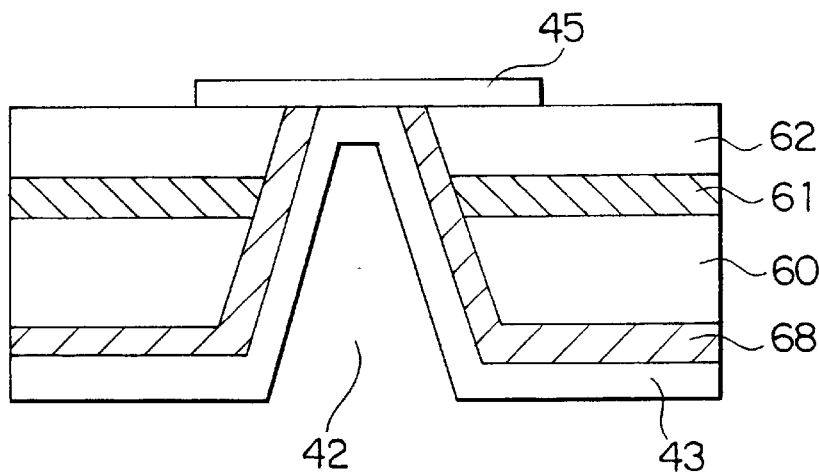
FIG. 15 is a partially broken view showing another process step of the semiconductor device manufacturing method according to the fourth embodiment of the invention.

FIGS. 14 and 15 show a fourth embodiment of the present invention. In this embodiment a p-type GaAs layer 61 constituting the buffer layer 34 and an n-type GaAs layer 62 in which an active layer 36 is to be formed are successively provided on a first or front surface of a semiconductor substrate 60 such as a GaAs substrate by means of the Metalorganic Chemical Vapor Deposition method. For example, the thickness of these layers are designed as follows: the GaAs substrate 60 is about 600 micrometers thick; the p-type GaAs layer 61 is in the range of about 4,000 angstroms to about 5,000 angstroms thick; the n-type GaAs layer 62 is about 6,000 angstroms thick. Here, it is to be noted that the semiconductor device as produced in this process step corresponds to that of FIG. 3 in the first embodiment.

Although in this embodiment, the MOCVD method is employed, the Molecular Beam Epitaxial method may also be used for the same purpose.

Subsequently, a resist pattern 63 masking only a surface region of the n-type GaAs layer 62 at which the FET 32 is to be provided is formed by means of lithography, and by the use of the thus formed resist pattern 63 as a mask, doping with boron ions (B$^+$ ions) are carried out to form the isolation region 41. The conditions for ion implantation are the same as those for the aforementioned first embodiment. The semiconductor device as produced in this process step corresponds to that of the first embodiment shown in FIG. 4.

Thereafter, the resist pattern 63 is removed, and a new resist pattern having apertures at locations corresponding to those portions at which the source electrode 40 and the drain electrode 39 are to be provided is formed at a portion of the surface of the active layer 36 surrounded by the isolation region 41. With the thus formed resist pattern used as a mask, the source electrode 40 and the drain electrode 39 are formed with aluminum by virtue of the deposition and lift-off method. The semiconductor device thus formed in this process step corresponds to that of FIG. 5 in the first embodiment.

A recess 37 is then formed in the active layer 36 or in the n-type semiconductor layer 35 by an etching process, and the gate electrode 38 is formed in the recess 37 by the vapor deposition and lift-off method.

Subsequently, the resist pattern 65 is removed, and the via hole upper electrode 45 connected to the source electrode 40 is formed by means of the vapor deposition and lift-off method on a surface of the isolation region 41 at which the via hole 42 is later formed. Further, a resist is coated on the backside surface 602 of the GaAs substrate 60 opposite the first or front surface 601, and a resist pattern is formed with an aperture at a location opposing the via hole upper electrode 45 by virtue of lithography. With the use of the thus formed resist pattern as a mask, portions of the GaAs substrate 60, the p-type GaAs layer 61 and the n-type GaAs layer 62 are removed by etching to expose the backside of the via hole upper electrode 45 to provide the via hole 42 surrounded by the inner wall 42. The etching liquid used here is sulfuric acid, for example.

Thereafter, the resist pattern is removed, and a part of or all of the second surface 602 of the GaAs substrate 60 including the inner surface 421 of the via hole 42 is implanted with ions such as boron plus ions from the side of the second surface 602 to render it insulating. The semiconductor device thus formed is shown partially in cross section in FIG. 14 in which the nonconductive layer is designated at reference numeral 68.

As shown in FIG. 15, the backside electrode 43 is then formed by means of electrolytic plating on and over the second surface 602 of the GaAs substrate 60 inclusive of the surface of the nonconductive layer 68 as well as the exposed rear surface of the via hole upper electrode 45.

With the semiconductor device thus formed in accordance with this embodiment, electrical conduction between the backside electrode 43 and the p-type buffer layer 34 is blocked by the nonconductive layer 68, thereby preventing leakage current from flowing between the gate electrode 38 and the source electrode 40. As a result, it is possible to avoid degradation of the gate-source dielectric resistance.

Furthermore, according to the semiconductor manufacturing method of this embodiment, a step for forming an insulating layer on the inner wall 421 of the via hole is omitted, so a mask pattern forming process step also becomes unnecessary for forming an insulating layer on the inner wall 421 except for the exposed rear surface of the via hole upper electrode 45.

Moreover, if ion implantation is effected from the surface of the n-type semiconductor layer 35, as disclosed in the aforementioned Japanese Patent Laid-Open No. 4-39968, when using elements of a relatively large atomic weight, there would often arise a situation that no sufficient insulation can be achieved to such a depth as the p-type buffer layer 34, and hence with the use of protons as doping ions, the electrical properties of the semiconductor element would be subjected to adverse influences. In contrast to this, according to this embodiment, the insulating layer can be produced in a very simple process, thus enabling the production of a semiconductor device with high reliability in a simple manner.

Embodiment 5

Figure 16:
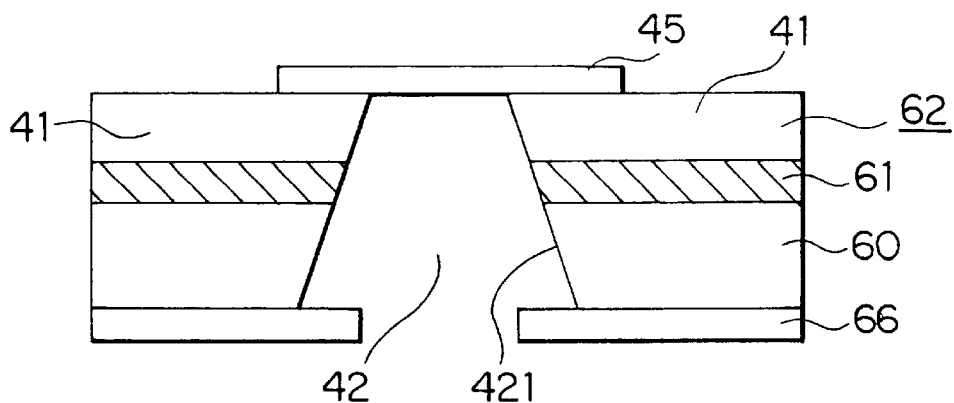
FIG. 16 is a partially broken view showing a process step of a method for manufacturing a semiconductor device according to a fifth embodiment of the invention.
Figure 17:
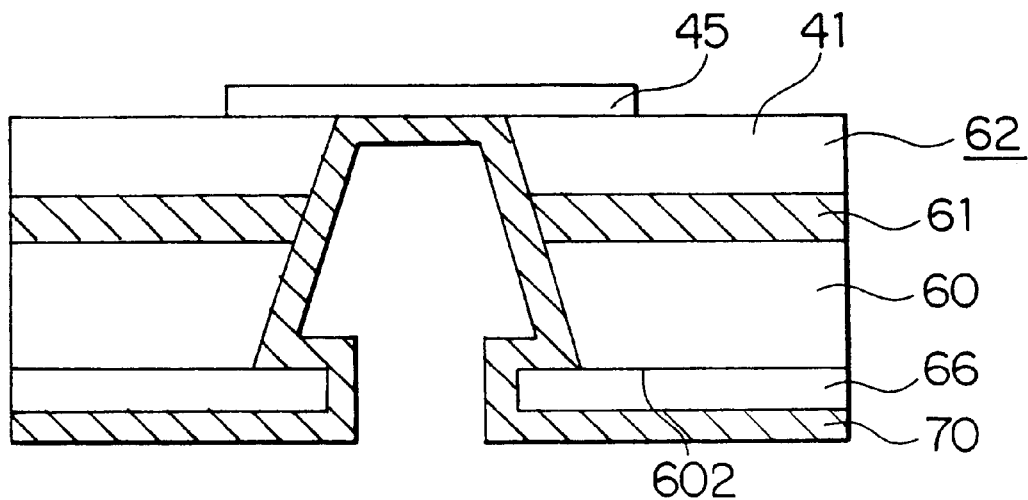
FIG. 17 is a partially broken view showing another process step of the semiconductor device manufacturing method according to the fifth embodiment of the invention.
Figure 18:
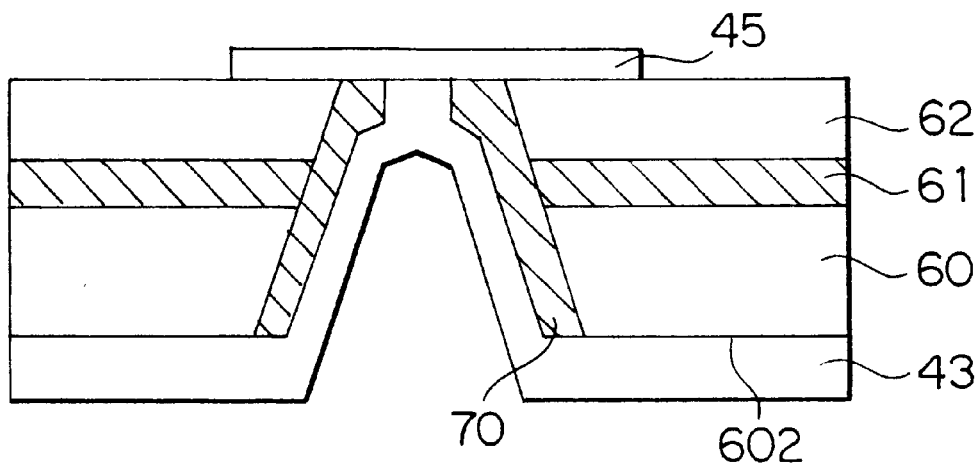
FIG. 18 is a partially broken view showing a further process step of the semiconductor device manufacturing method according to the fifth embodiment of the invention.

FIGS. 16, 17 and 18 illustrate respective process steps of a method of manufacturing a semiconductor device in accordance with a fifth embodiment of the present invention. In the manufacturing method of this embodiment, the process steps up to a step in which a via hole 42 defined by an inner wall 421 is made substantially the same as in the fourth embodiment.

FIG. 16 shows a partial cross section of a semiconductor device after such a via hole forming step has been finished.

After the formation of the via hole, an insulating film 70 formed of an electrically insulating material such as SiON is deposited, by means of the CVD method, for example, on the surface of the resist pattern 66 with a thickness of 500 angstroms, as shown in FIG. 17.

A part of the insulating film 70, which is in contact with the via hole upper electrode 451, is selectively removed by means of the RIE method, after which the resist pattern 66 is also removed, and the backside electrode 43 is formed by means of the electrode plating, for example, on the second surface 602 of the GaAs substrate 60, the remaining insulating layer 70 being left on the inner wall 421 of the via hole 42 and the exposed rear surface of the via hole upper electrode 45, as shown in FIG. 18.

According to the semiconductor manufacturing method of this fifth embodiment, the insulating layer 70 is between the backside electrode 43 in contact with the via hole upper electrode 45 and the p-type GaAs layer 61 constituting the buffer layer 34, so that there develops no leakage current between the gate electrode 38 and the source electrode 40. Thus, it is possible to provide a semiconductor device having a superior gate-source dielectric resistance which is less subject to degradation. In the manufacture of such a semiconductor device, the insulating layer 70 is formed with the resist pattern 66 left for formation of the via hole 42, and that part of the insulating layer 70 which is in contact with the via hole upper electrode 451 is removed from the backside of the wafer by the RIE method while taking advantage of the aperture in the resist pattern 66, so that a master pattern forming process step can be omitted, which would otherwise be required for partially removing an insulating layer to be formed after formation of the via hole. This serves to further simplify the entire manufacturing steps.

Embodiment 6

Figure 19:
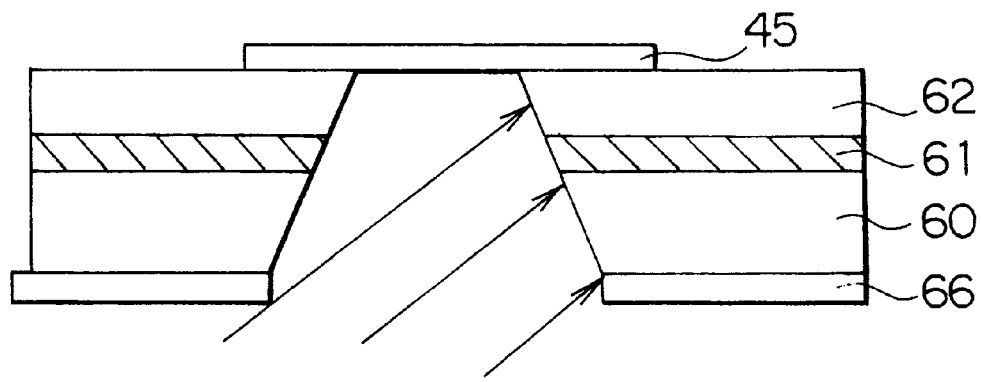
FIG. 19 is a partially broken view showing a process step of a method for manufacturing a semiconductor device according to a sixth embodiment of the invention.
Figure 20:
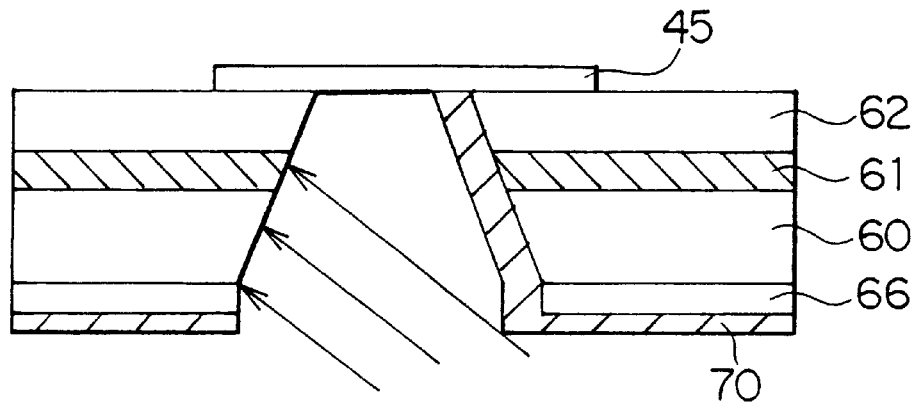
FIG. 20 is a partially broken view showing another process step of the semiconductor device manufacturing method according to the sixth embodiment of the invention.
Figure 21:
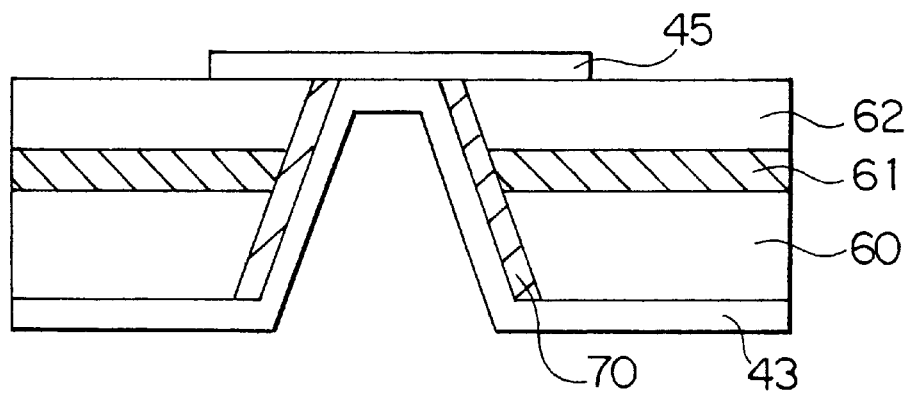
FIG. 21 is a partially broken view showing a further process step of the semiconductor device manufacturing method according to the sixth embodiment of the invention.

FIGS. 19, 20 and 21 show respective process steps of a semiconductor manufacturing method in accordance with a sixth embodiment of the present invention. In the manufacturing process of this embodiment, the process steps up to a step of forming a via hole 42 defined by an inner wall 421 are substantially the same as those in the fifth embodiment.

After formation of the via hole 42, a resist protruding from the periphery of the inner wall 421 of the via hole 42 is removed so as to coincide with the periphery of the via hole inner wall 421, whereby an aperture in the resist pattern 66 is rendered congruent with the via hole 42. An insulating layer 70 of SiO or the like having a thickness of about 500 angstroms is formed from above the resist pattern 66 by means of a skewed or angled vapor deposition method on the inner wall 421 of the via hole 42 and on the p-type GaAs layer 61 excluding the exposed backside surface of the via hole upper electrode 45 while rotating the wafer, as shown in FIGS. 19 and 20.

Subsequently, the resist pattern 66 is removed while leaving the insulating film 70 on the inner wall 421 of the via hole 42, and a backside electrode 43 is formed, by electrolytic plating, for example, on the second surface 602 of the GaAs substrate 60, the insulating film 70 remaining on the inner wall 421 of the via hole 42, and the exposed rear surface of the via hole upper electrode 45, as shown in FIG. 21.

According to the semiconductor manufacturing method of this embodiment, the insulating film 70 is provided the backside electrode 43 contacting the via hole upper electrode 45 and the p-type GaAs layer 61 constituting the buffer layer 34, so that no leakage current develops between the gate electrode 38 and the source electrode 40. Therefore, an excellent semiconductor device can be provided which has a never-degrading gate-source dielectric resistance characteristic. In the manufacture of such a semiconductor device, the aperture in the resist pattern 66 and the via hole 42 are in coincidence with each other while leaving the resist pattern 66 for forming the via hole 42, and the insulating film 70 is then formed from above the resist pattern 66 by the skewed or angled vapor deposition method while rotating the wafer. With these process steps, the master pattern forming process for partially removing the insulating film to be formed after the formation of the via hole can be omitted, thus simplifying the entire manufacturing method.

Embodiment 7

Figure 22:
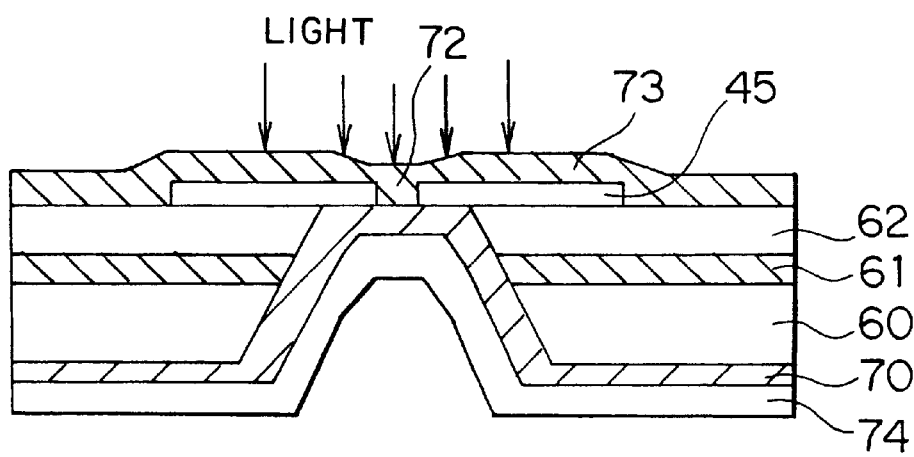
FIG. 22 is a partially broken view showing a process step of a method for manufacturing a semiconductor device according to a seventh embodiment of the invention.
Figure 23:
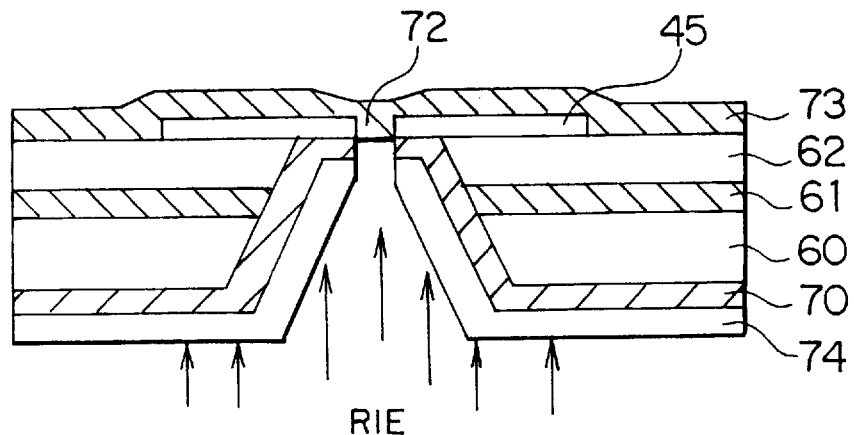
FIG. 23 is a partially broken view showing another process step of the semiconductor device manufacturing method according to the seventh embodiment of the invention.
Figure 24:
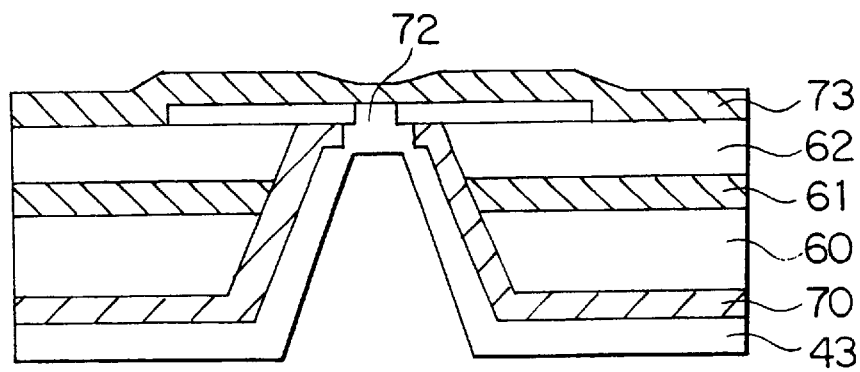
FIG. 24 is a partially broken view showing a further process step of the semiconductor device manufacturing method according to the seventh embodiment of the invention.

FIGS. 22, 23 and 24 show respective process steps of a semiconductor manufacturing method according to a seventh embodiment of the present invention. In the manufacturing method of this embodiment, the process steps up to the via hole upper electrode forming step in which the via hole upper electrode 45 is formed on the surface of the isolation region 41 at which the via hole 42 is to be provided are substantially the same as in the aforementioned fourth embodiment.

After the via hole upper electrode forming step, at the center of the via hole upper electrode 45, there is formed an opening 72 having a size (e.g., a diameter of 10–30 micrometers, for example) required for electrical connection between the backside electrode that is later formed and the via hole upper electrode 45, the opening 72 leading to the n-type GaAs layer 62 in which the active layer 36 is formed. A via hole upper insulating film 73 formed, for example, of SiON and having a thickness of about 1,000 angstroms is deposited by using, for example, the plasma CVD method so as to cover the via hole upper electrode 45.

Subsequently, a resist is applied to the second surface 602 of the GaAs substrate 60 opposite the first surface 601, and a resist pattern is then formed by a lithography process, the resist pattern having an aperture formed at a location opposing the via hole upper electrode 45. With the thus formed resist pattern being used as a mask, parts of the GaAs substrate 60, the p-type GaAs layer 61 and the n-type GaAs layer 62 are removed by etching to expose the backside surface of the via hole upper electrode 45, thus forming the via hole 42 defined by the inner wall 421. The etching liquid used here is a sulfuric acid solution.

Thereafter, the resist pattern is removed, and an insulating film 70 having a thickness of about 500 angstroms and formed of SiON and the like is provided, for example, by the plasma CVD method, on the second surface 602 of the GaAs substrate 60, the inner wall 421 of the via hole 42, the exposed rear surface of the via hole upper electrode 45 and the exposed surface of the via hole upper insulating film 73.

On the thus formed insulating film 70, a resist 74 is coated, and light is irradiates to the resist 74 from above the surface of the via hole upper insulating film 73 to pass through the opening 70 in the via hole upper insulating film 73 and the insulating film 70 so as to focus on that portion of the resist 74 opposing the opening 72, as shown in cross section in FIG. 22.

A development process is then performed so that the portion of the resist 74 opposing the exposed opening 72 alone is removed to form an aperture. The resist 74 is subjected to etching using the RIE method or hydrofluoric acid, whereby the via hole upper insulating film 73 at the opening 72 is removed to expose the via hole upper electrode 45, as shown in cross section in FIG. 23.

Subsequently, the resist 74 is removed, and the surface of the insulating film 70 and the exposed rear surface of the via hole upper electrode 45 are subjected to electrolytic plating to provide thereon the backside electrode 43, as clearly shown in FIG. 24.

According to the semiconductor manufacturing method of this embodiment, the insulating film 70 is present between the backside electrode 43 connected to the via hole upper electrode 45 and the p-type GaAs layer 61 constituting the buffer layer 34, so that leakage current can be prevented from flowing between the gate electrode 38 and the source electrode 40 by means of the insulating film 70. As a result, an excellent semiconductor device can be provided which has a never-degrading gate-source dielectric resistance. In the manufacture of such a semiconductor device, when etching the insulating film 70 in order to establish electrical connection between the backside electrode 43 and the via hole upper electrode 45, the resist 74 coated on the surface of the insulating film 70 is subjected to exposure through the opening 72 in the via hole upper electrode 45 to form the aperture therein. With this procedure, it is not required to effect positioning or matching of a mask, resulting in a simplified manufacturing process.

Embodiment 8

Figure 25:
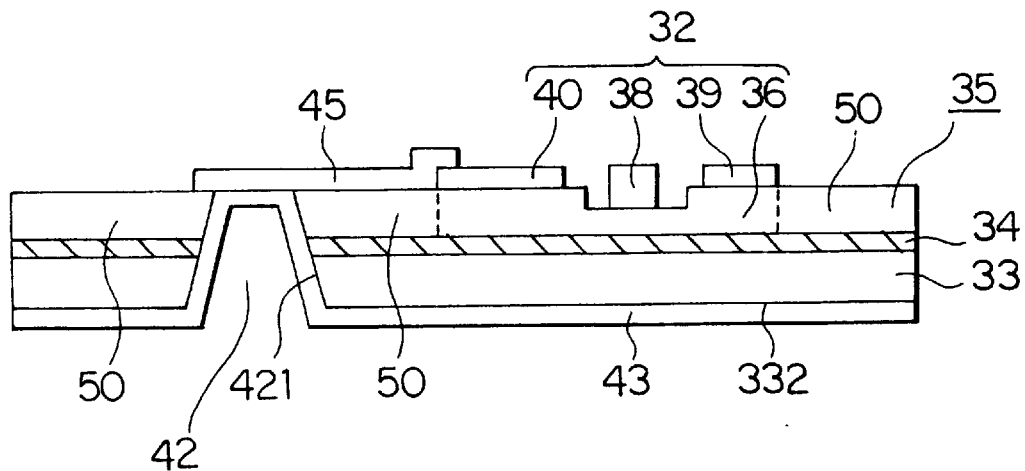
FIG. 25 is a cross sectional view of a semiconductor device according to an eighth embodiment of the invention.
Figure 26:
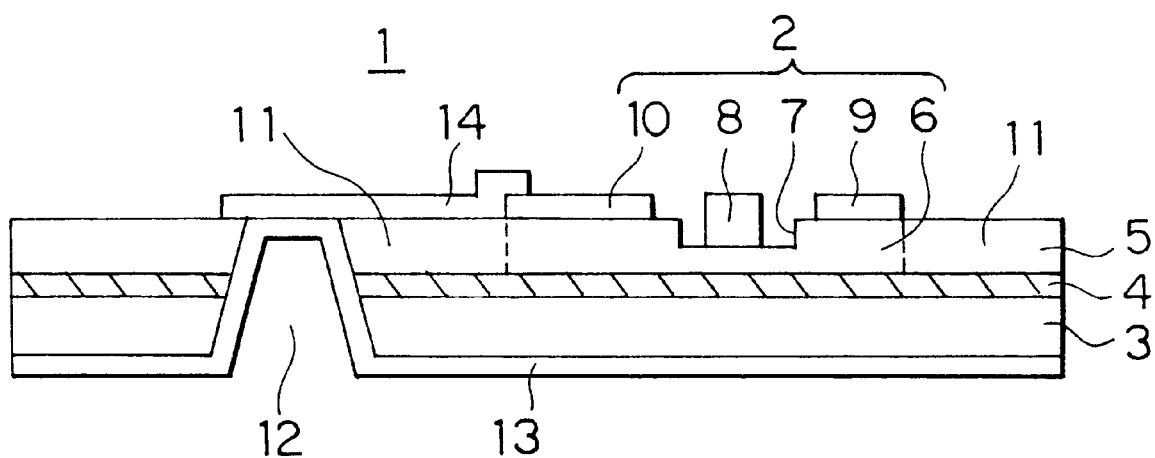
FIG. 26 is a cross sectional view of a conventional semiconductor device.

FIG. 25 shows a semiconductor device constructed in accordance with a eighth embodiment of the present invention. In FIG. 25, reference numeral 50 designates an isolation region into which protons are implanted. In this figure, the same or corresponding parts are identified by the same reference numerals employed in the foregoing embodiments.

This embodiment is substantially similar to the first embodiment except for the use of protons in place of boron ions for forming the isolation region 50. The use of protons permits the deposited layer to be rendered nonconductive to the depth as the p-type GaAs layer 61 by employing an ordinary ion doping apparatus.

With the HBT or HEMT method, the protons can intrude into the active layer 36, adversely affecting the long-term reliability of the semiconductor device, but those which require reliability not for a long period of time can be produced at low cost.

Mover, with the FETs, intrusion of protons into the active layer 36 gives rise to no substantial influence on the electrical properties, so reliable semiconductor devices can be provided at reasonable prices.

Although in the aforesaid embodiments, the present invention is applied mainly to the FETs, it can also be applied to GaAs or InP HEMTs which have a buffer layer composed of an electrically conductive semiconductor layer such as a p-type InGaAs layer, with the substantially same advantages.

What is claimed is:

1. A semiconductor device comprising:
a semiconductor substrate having a first surface and a second surface;
a first semiconductor layer disposed on the first surface of said semiconductor substrate;
a second semiconductor layer disposed on said first semiconductor layer and having an opposite conductivity type from said first semiconductor layer, said second semiconductor layer having a semiconductor element forming region and a remaining portion;
a semiconductor element disposed in the semiconductor element forming region of said second semiconductor layer;
an ion implanted region in the remaining portion of said second semiconductor layer isolating said semiconductor element forming region from the remaining portion of said second semiconductor layer;
a via hole having an inner wall and disposed in the remaining portion of said second semiconductor layer and extending from said second semiconductor layer to the second surface of said semiconductor substrate;
an isolation groove penetrating through said first and second semiconductor layers and having a depth extending from said second semiconductor layer through said first semiconductor layer and into said semiconductor substrate, circumferentially surrounding said semiconductor element forming region, for isolating the via hole from said semiconductor element forming region;
a conductive layer disposed on the inner wall and electrically connected to said first semiconductor layer; and
a wiring layer disposed on said second semiconductor layer and electrically connected to said conductive layer, said wiring layer being electrically connected to a portion of said semiconductor element across the isolation groove.

2. The semiconductor device as claimed in claim 1, further including an active region of said semiconductor element, wherein said semiconductor element comprises a source electrode, a gate electrode, and a drain electrode all disposed on said active region of said semiconductor element, either one of said source electrode and said drain electrode being connected to said wiring layer.

3. The semiconductor device as claimed in claim 2, wherein said semiconductor substrate is formed of a compound semiconductor material.

4. The semiconductor device as claimed in claim 3, wherein said compound semiconductor material is a semi-insulating material.

5. The semiconductor device as claimed in claim 4, wherein said compound semiconductor material is selected from the group consisting of GaAs and InP.

6. A semiconductor device comprising:
a semiconductor substrate having a first surface and a second surface;
a first semiconductor layer disposed on the first surface of said semiconductor substrate;
a second semiconductor layer disposed on said first semiconductor layer and having an opposite conductivity type from said first semiconductor layer, said second semiconductor layer having a semiconductor element forming region and a remaining portion;
a semiconductor element disposed in the semiconductor element forming region of said second semiconductor layer;
an ion implanted region in the remaining portion of said second semiconductor layer isolating said semiconductor element forming region from the remaining portion of said second semiconductor layer;
a via hole having an inner wall and disposed in the remaining portion of said second semiconductor layer and extending from said second semiconductor layer to the second surface of said semiconductor substrate;
an isolation groove penetrating through said first and second semiconductor layers and having a depth extending from said second semiconductor layer through said first semiconductor layer and into said semiconductor substrate, spaced from and circumferentially surrounding the via hole for isolating the via hole from said semiconductor element forming region;
a conductive layer disposed on the inner wall and electrically connected to said first semiconductor layer; and
a wiring layer disposed on said second semiconductor layer and electrically connected to said conductive layer, said wiring layer being electrically connected to a portion of said semiconductor element across the isolation groove.

7. The semiconductor device as claimed in claim 6, including an active region in said semiconductor element wherein said semiconductor element comprises a source electrode, a gate electrode, and a drain electrode, all disposed on said active region of said semiconductor element, one of said source electrode and said drain electrode being connected to said wiring layer.

8. The semiconductor device as claimed in claim 7, wherein said semiconductor substrate is a compound semiconductor material.

9. The semiconductor device as claimed in claim 8, wherein said compound semiconductor material is semi-insulating.

10. The semiconductor device as claimed in claim 9, wherein said semi-insulating material is selected from the group consisting of GaAs and InP.

11. A semiconductor device comprising:
a semiconductor substrate having a first surface and a second surface;
a first semiconductor layer disposed only on part of the first surface of said semiconductor substrate;
a second semiconductor layer disposed only on said first semiconductor layer and having an opposite conductivity type from said first semiconductor layer, said second semiconductor layer having a semiconductor element forming region and a remaining portion;
a semiconductor element disposed in the semiconductor element forming region of said second semiconductor layer;
an ion implanted region in the remaining portion of said second semiconductor layer isolating said semiconductor element forming region;
a via hole having an inner wall and extending through said semiconductor substrate, spaced from said first semiconductor layer, said first and second semiconductor layers forming a step having a height extending from said semiconductor substrate to said second semiconductor layer, circumferentially surrounding the remaining portion of said second semiconductor layer, isolating the via hole from said semiconductor element forming region;

a conductive layer disposed on the inner wall; and a wiring layer disposed on said second semiconductor layer and electrically connected to said conductive layer, said wiring layer being electrically connected to a portion of said semiconductor element across the step.

12. The semiconductor device as claimed in claim 11, including an active region in said semiconductor element wherein said semiconductor element comprises a source electrode, a gate electrode, and a drain electrode, all disposed on said active region of said semiconductor element, one of said source electrode and said drain electrode being connected to said wiring layer.

13. The semiconductor device as claimed in claim 12, wherein said semiconductor substrate is a compound semiconductor material.

14. The semiconductor device as claimed in claim 13, wherein said compound semiconductor material is semi-insulating.

15. The semiconductor device as claimed in claim 14, wherein said semi-insulating material is selected from the group consisting of GaAs and InP.

* * * * *